(12) United States Patent
Lee et al.

(10) Patent No.: US 11,563,066 B2
(45) Date of Patent: Jan. 24, 2023

(54) ORGANIC LIGHT EMITTING DISPLAY DEVICE INCLUDING A GROOVED PLANARAZATION LAYER

(71) Applicant: Samsung Display Co., LTD., Yongin-si (KR)

(72) Inventors: Eonjoo Lee, Hwaseong-si (KR); Jin-Whan Jung, Chungcheongnam-do (KR); Hyoeng-Ki Kim, Suwon-si (KR); Junhyuk Woo, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 152 days.

(21) Appl. No.: 17/023,623

(22) Filed: Sep. 17, 2020

(65) Prior Publication Data
US 2021/0005691 A1  Jan. 7, 2021

Related U.S. Application Data

(62) Division of application No. 16/217,806, filed on Dec. 12, 2018, now Pat. No. 10,811,480.

(30) Foreign Application Priority Data

Dec. 18, 2017 (KR) .......................... 10-2017-0174593

(51) Int. Cl.
  *H01L 27/32* (2006.01)
  *H01L 51/00* (2006.01)
  *H01L 51/52* (2006.01)

(52) U.S. Cl.
  CPC ...... *H01L 27/3258* (2013.01); *H01L 27/3248* (2013.01); *H01L 27/3276* (2013.01);
  (Continued)

(58) Field of Classification Search
  CPC ............. H01L 27/3258; H01L 27/3248; H01L 27/3276; H01L 27/3262; H01L 27/3246;
  (Continued)

(56) References Cited

U.S. PATENT DOCUMENTS 7,531,834 B2 * 5/2009 Lee ...................... H01L 27/3246
                                                         257/E51.026
9,614,015 B2 * 4/2017 Park .................... H01L 27/3246
(Continued)

FOREIGN PATENT DOCUMENTS

KR  10-2014-0127629  11/2014
KR  10-2016-0085986   7/2016
(Continued)

OTHER PUBLICATIONS

Korean Office Action for Korean Patent Application or Patent No. 10-2017-0174593, dated Mar. 7, 2022.

*Primary Examiner* — Ida M Soward
(74) *Attorney, Agent, or Firm* — Kile Park Reed & Houtteman PLLC

(57) ABSTRACT

An organic light emitting display (OLED) device includes a substrate, a semiconductor element on the substrate, a planarization layer on the semiconductor, and a light emitting structure on the planarization layer. The planarization layer includes a contact hole exposing a portion of the semiconductor and a plurality of grooves surrounding the contact hole. The light emitting structure is electrically connected to the semiconductor element via the contact hole.

14 Claims, 15 Drawing Sheets

(52) U.S. Cl.
CPC ...... *H01L 51/0097* (2013.01); *H01L 51/5209* (2013.01); *H01L 51/5253* (2013.01); *H01L 51/5281* (2013.01); *H01L 27/322* (2013.01); *H01L 27/3211* (2013.01); *H01L 27/3213* (2013.01); *H01L 27/3246* (2013.01); *H01L 2251/301* (2013.01); *H01L 2251/5338* (2013.01)

(58) Field of Classification Search
CPC ............... H01L 27/3295; H01L 27/322; H01L 27/3211; H01L 27/3213; H01L 51/0097; H01L 51/5209; H01L 51/5253; H01L 51/5281; H01L 51/5237; H01L 51/5203; H01L 51/5268; H01L 2251/301; H01L 2251/5338; G02F 2001/133357
See application file for complete search history.

(56) References Cited

U.S. PATENT DOCUMENTS

| | | | | |
|---|---|---|---|---|
| 9,614,017 | B2 * | 4/2017 | Li | H01L 27/3262 |
| 9,673,421 | B2 * | 6/2017 | Sun | H01L 27/3258 |
| 9,835,770 | B2 | 12/2017 | Kim et al. | |
| 10,199,606 | B2 * | 2/2019 | Teramoto | H01L 27/3246 |
| 10,411,223 | B2 * | 9/2019 | Inoue | H01L 27/3262 |
| 2002/0191122 | A1 * | 12/2002 | Tanaka | G02F 1/136227 349/43 |
| 2004/0017153 | A1 * | 1/2004 | Nishikawa | H01L 27/3258 313/506 |
| 2006/0062270 | A1 * | 3/2006 | Okutani | H01L 51/5268 372/64 |
| 2007/0096636 | A1 * | 5/2007 | Park | H01L 27/3246 313/503 |
| 2008/0024402 | A1 * | 1/2008 | Nishikawa | H05B 33/22 345/82 |
| 2014/0145979 | A1 | 5/2014 | Lee | |
| 2014/0346449 | A1 * | 11/2014 | Choi | H01L 27/3258 438/23 |
| 2015/0102292 | A1 * | 4/2015 | Kim | H01L 51/5246 257/40 |
| 2015/0138463 | A1 * | 5/2015 | Jinta | G02F 1/133345 349/33 |
| 2015/0380466 | A1 * | 12/2015 | Koo | H01L 27/322 438/70 |
| 2016/0155787 | A1 * | 6/2016 | Lee | H01L 51/5209 438/23 |
| 2017/0005286 | A1 * | 1/2017 | Yun | H01L 51/5225 |
| 2017/0084677 | A1 * | 3/2017 | Ha | H01L 51/5268 |
| 2017/0092705 | A1 * | 3/2017 | Lim | H01L 27/326 |
| 2017/0294493 | A1 * | 10/2017 | Yoo | H01L 51/5275 |
| 2018/0190719 | A1 * | 7/2018 | Kim | H01L 27/326 |
| 2018/0197894 | A1 * | 7/2018 | Shi | H01L 27/1248 |

FOREIGN PATENT DOCUMENTS

| | | |
|---|---|---|
| KR | 10-2016-0091529 | 8/2016 |
| KR | 10-2016-0098601 | 8/2016 |
| KR | 10-1695317 | 1/2017 |
| KR | 10-2017-0038338 | 4/2017 |
| KR | 10-2017-0062999 | 6/2017 |

* cited by examiner

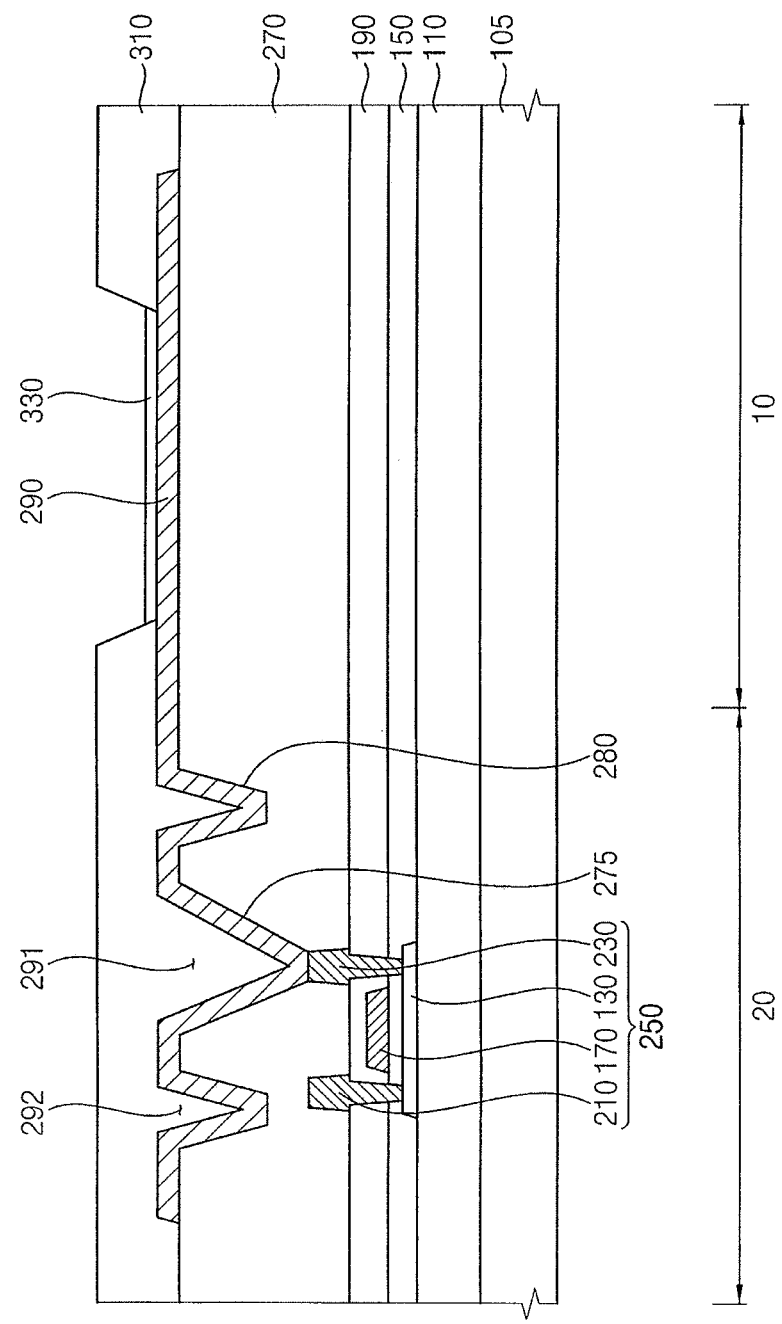

ORGANIC LIGHT EMITTING DISPLAY DEVICE INCLUDING A GROOVED PLANARAZATION LAYER

CROSS-REFERENCE TO RELATED APPLICATION(S)

This is a divisional application based on currently U.S. patent application Ser. No. 16/217,806, filed on Dec. 12, 2018 (now issued as U.S. Pat. No. 10,811,480), the disclosure of which is incorporated herein by reference in its entirety. U.S. patent application Ser. No. 16/217,806 claims priority benefit of Korean Patent Application No. 10-2017-0174593, filed on Dec. 18, 2017, in the Korean Intellectual Property Office, the disclosure of which is incorporated herein by reference in its entirety for all purposes.

BACKGROUND

1. Field

Example embodiments relate generally to display devices, for example, organic light emitting display devices.

2. Description of the Related Art

A flat panel display (FPD) device is widely used as a display device of an electronic device because the FPD device is lightweight and thin compared to a cathode-ray tube (CRT) display device. Typical examples of the FPD device are a liquid crystal display (LCD) device and an organic light emitting display (OLED) device. Compared to the LCD device, the OLED device has many advantages such as a higher luminance and a wider viewing angle. In addition, the OLED device can be made thinner because the OLED device does not require a backlight. In the OLED device, electrons and holes are injected into an organic thin layer through a cathode and an anode, and then recombined in the organic thin layer to generate excitons, thereby a light of a certain wavelength can be emitted.

SUMMARY

Embodiments are directed to an organic light emitting display (OLED) device including a substrate, a semiconductor element on the substrate, a planarization layer on the semiconductor, the planarization layer including a contact hole exposing a portion of the semiconductor and a plurality of grooves surrounding the contact hole; and a light emitting structure on the planarization layer, the light emitting structure being electrically connected to the semiconductor element via the contact hole.

The grooves may be spaced apart from the contact hole by a predetermined distance and may be arranged along a shape of an outer portion of the contact hole.

The grooves may be spaced apart from each other.

The grooves may include first through (M)th grooves, where M is an integer greater than 1. (K)th and (K+1)th grooves among the first through (M)th grooves are spaced apart from each other, where K is an integer between 1 and M.

The grooves may overlap each other and may be integrally formed. Each of the grooves may have a plan shape of a hollow circle.

The grooves may include first through (M)th grooves, where M is an integer greater than 1. (K)th and (K+1)th grooves among the first through (M)th grooves may overlap each other and may be integrally formed. The (K)th and (K+1)th grooves may have a plan shape of a hollow circle.

The light emitting structure may include a lower electrode on the planarization layer, a light emitting layer on the lower electrode, and an upper electrode on the light emitting layer.

The lower electrode may be electrically connected to the semiconductor element via the contact hole. The contact hole may not overlap the light emitting layer.

The lower electrode may include a first trench overlapping the contact hole of the planarization layer and a second trench overlapping the grooves of the planarization layer.

A size of the first trench may be greater than a size of the second trench.

The lower electrode may be electrically connected to the semiconductor element via the contact hole. The contact hole may overlap the light emitting layer.

The semiconductor element may overlap the light emitting layer.

The lower electrode may be located along a profile of an upper surface of the planarization layer and may include trenches that overlap a portion where each of the contact hole and the grooves of the planarization layer is located The lower electrode may include a first trench overlapping the contact hole of the planarization layer, and a second trench overlapping the grooves of the planarization layer.

A size of the first trench may be greater than a size of the second trench.

The light emitting layer may be located along a profile of an upper surface of the lower electrode and may include third and fourth trenches that overlap a portion where each of the first and second trenches of the lower electrode is located.

The semiconductor element may include an active layer on the substrate, a gate electrode on the active layer, and source and drain electrodes on the gate electrode.

The planarization layer may expose an upper surface of the drain electrode. The light emitting layer may be in direct contact with the drain electrode.

The OLED device may further include a thin film encapsulation structure on the light emitting structure. The substrate and the thin film encapsulation structure may have flexibility.

The thin film encapsulation structure may include a first thin film encapsulation layer on the light emitting structure, the first thin film encapsulation layer including inorganic materials, a second thin film encapsulation layer on the first thin film encapsulation layer, the second thin film encapsulation layer including organic materials, and a third thin film encapsulation layer on the second thin film encapsulation layer, the third thin film encapsulation layer including the organic materials.

BRIEF DESCRIPTION OF THE DRAWINGS

Features will become apparent to those of skill in the art by describing in detail exemplary embodiments with reference to the attached drawings in which:

FIGS. 4 through 9 illustrate cross-sectional views depicting stages of a method of manufacturing an OLED device in accordance with example embodiments;

DETAILED DESCRIPTION

Figure 1:
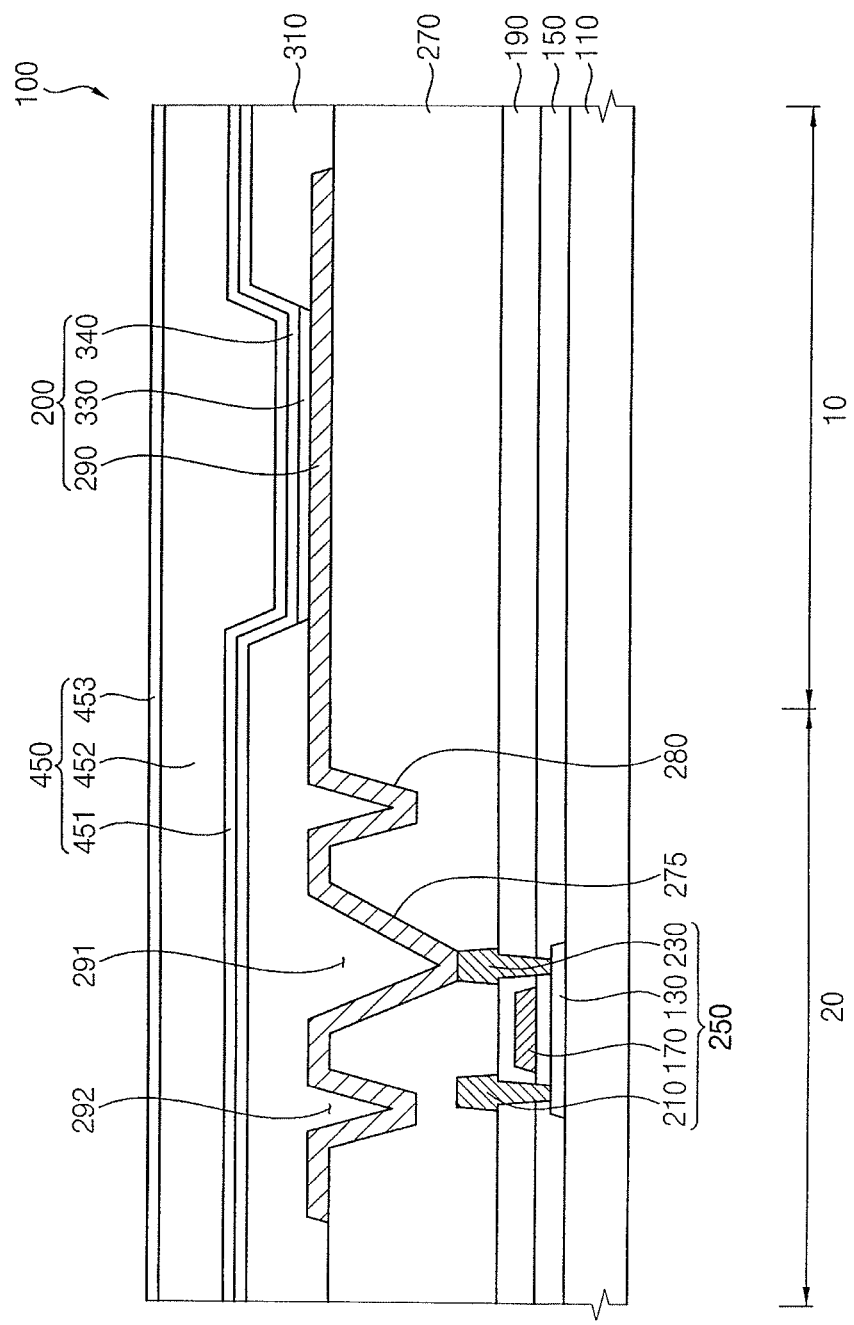
FIG. 1 illustrates a cross-sectional view depicting an organic light emitting display (OLED) device in accordance with example embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 2:
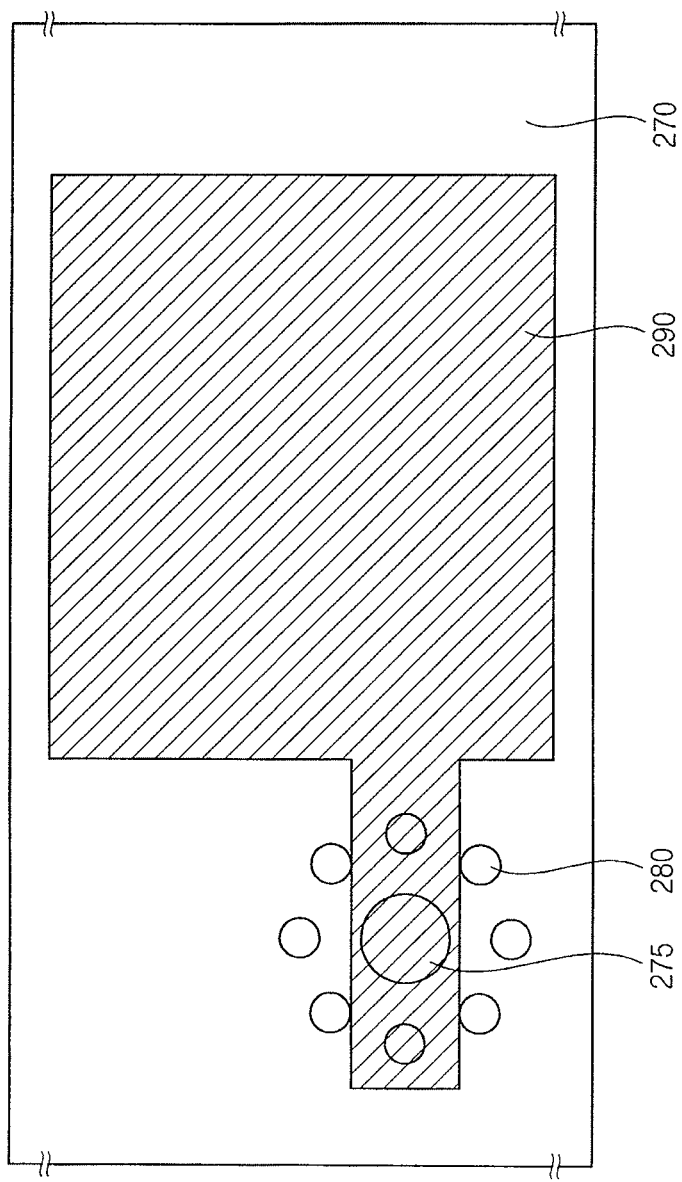
FIG. 2 illustrates a plan view for describing a contact hole and grooves of a planarization layer included in the OLED device of FIG. 1.
Figure 3:
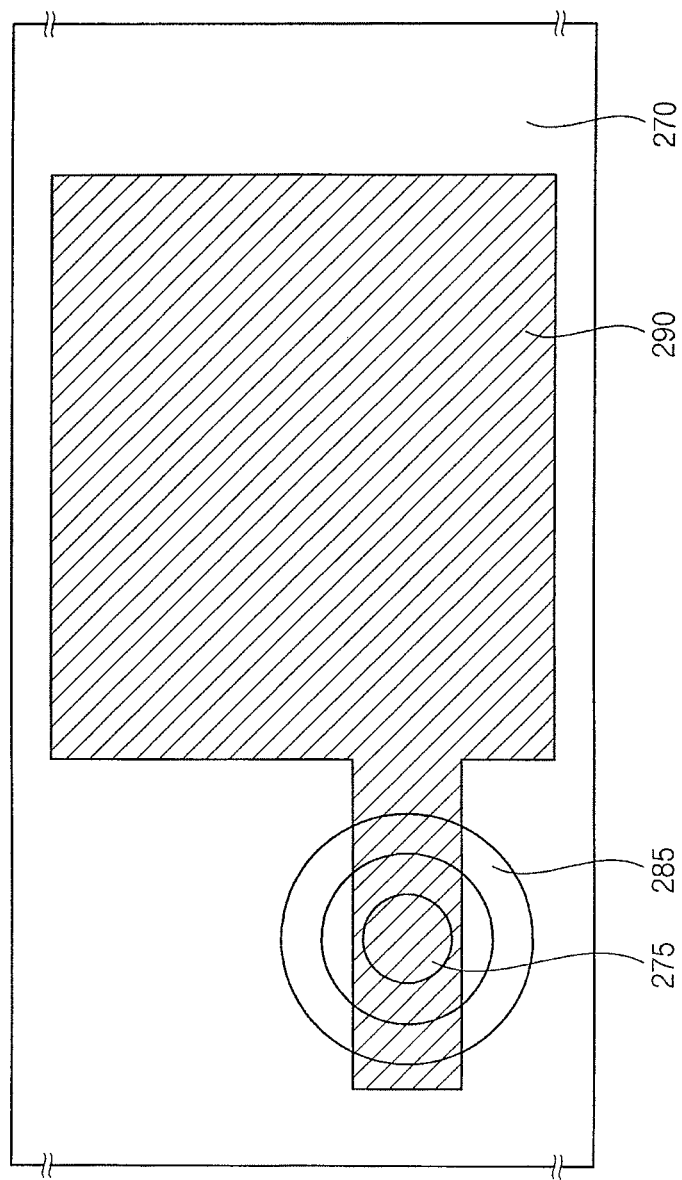
FIG. 3 illustrates a plan view depicting an example of the grooves of the planarization layer of FIG. 2.

FIG. 1 illustrates a cross-sectional view depicting an organic light emitting display (OLED) device in accordance with example embodiments, and FIG. 2 illustrates a plan view for describing a contact hole and grooves of a planarization layer included in the OLED device of FIG. 1. FIG. 3 illustrates a plan view illustrating an example of the grooves of the planarization layer of FIG. 2.

Referring to FIGS. 1 and 2, an organic light emitting display (OLED) device 100 may include a substrate 110, a semiconductor element 250, a gate insulation layer 150, an insulating interlayer 190, a planarization layer 270, a light emitting structure 200, a pixel defining layer 310, a thin film encapsulation (TFE) structure 450, etc. The light emitting structure 200 may include a lower electrode 290, a light emitting layer 330, and an upper electrode 340. The semiconductor element 250 may include an active layer 130, a gate electrode 170, a source electrode 210, and a drain electrode 230. The TFE structure 450 may include a first TFE layer 451, a second TFE layer 452, and a third TFE layer 453.

The OLED device 100 may include a light emitting region 10 and a peripheral region 20. A display image may be displayed in the light emitting region 10 through the light emitting structure 200, and the peripheral region 20 may correspond to a non-display region. For example, the OLED device 100 may have a plurality of the light emitting regions 10 and a plurality of the peripheral regions 20, and the light emitting structure 200 may be disposed in each of the light emitting regions 10. In addition, the OLED device 100 may include a plurality of the semiconductor elements 250. The semiconductor elements 250 may be disposed in the light emitting region 10 and the peripheral region 20.

The substrate 110 may include transparent or opaque insulation materials. The substrate 110 may include a flexible transparent resin substrate. In example embodiments, the substrate 110 may have a configuration in which a first organic layer, a first barrier layer, a second organic layer, and a second barrier layer are sequentially stacked. The first barrier layer and the second barrier layer each may include inorganic materials such as silicon oxide, etc. The first organic layer and the second organic layer each may include organic materials such as a polyamide-based resin. In example embodiments, each of the first and second barrier layers may block moisture or water that may permeate through the first and second organic layers.

The substrate 110 may be relatively thin and flexible. In that case, it may be difficult to directly form the semiconductor element 250 and the light emitting structure 200 on the substrate 110. The substrate 110 may be disposed on a rigid glass substrate to help support the formation of the semiconductor element 250 and the light emitting structure 200. In a manufacturing the OLED device 100, after an insulation layer (e.g., a buffer layer) is provided on the second barrier layer of the substrate 110, the semiconductor element 250 and the light emitting structure 200 may be disposed on the insulation layer. After the semiconductor element 250 and the light emitting structure 200 are formed on the insulation layer, the rigid glass substrate on which the substrate 110 is disposed may be removed. Accordingly, the semiconductor element 250 and the light emitting structure 200 may be formed on the substrate 110 and the rigid glass substrate, and then the substrate 110 including the first organic layer, the first barrier layer, the second organic layer, and the second barrier layer may serve as the substrate 110 of the OLED device 100 after the removal of the rigid glass substrate. In some implementations, the substrate 110 may include a quartz substrate, a synthetic quartz substrate, a calcium fluoride substrate, a fluoride-doped quartz substrate, a soda-lime glass substrate, a non-alkali glass substrate etc.

In some implementations, the substrate 110 may include a single layer or a plurality of layers. For example, the substrate 110 may include four-layers.

The OLED device 100 may include the light emitting region 10 and the peripheral region 20. Accordingly, the substrate 110 may be considered as divided between the light emitting region 10 and the peripheral region 20.

A buffer layer may be disposed on the substrate 110. For example, the buffer layer may be disposed on the entire substrate 110. The buffer layer may prevent the diffusion of metal atoms and/or impurities from the substrate 110 into the semiconductor element 250 and the light emitting structure 200. In addition, the buffer layer may control a rate of a heat transfer in a crystallization process for forming the active layer 130, such that a substantially uniform active layer may be obtained. Further, the buffer layer may improve a surface flatness of the substrate 110. In some example embodiments, according to a type of the substrate 110, at least two buffer layers may be provided on the substrate 110, or the buffer layer may be omitted. The buffer layer may include organic materials or inorganic materials.

The active layer 130 may be disposed in the peripheral region 20 of the substrate 110. The active layer 130 may include an oxide semiconductor, an inorganic semiconductor (e.g., amorphous silicon, polysilicon, etc.), an organic semiconductor, etc.

The gate insulation layer 150 may be disposed on the active layer 130. The gate insulation layer 150 may cover the active layer 130 in the peripheral region 20 of the substrate 110. In some implementations, the gate insulation layer 150 may be disposed on the entire substrate 110. For example, the gate insulation layer 150 may sufficiently cover the active layer 130 on the substrate 110, and may have a substantially flat upper surface without a step around the active layer 130. In some implementations, the gate insulation layer 150 may cover the active layer 130 on the substrate 110, and may be disposed with a substantially uniform thickness along a profile of the active layer 130. The gate insulation layer 150 may include silicon compound, metal oxide, etc. For example, the gate insulation layer 150 may include silicon oxide (SiOx), silicon nitride (SiNx), silicon oxynitride (SiOxNy), silicon oxycarbide (SiOxCy), silicon carbon nitride (SiCxNy), aluminum oxide (AlOx), aluminum nitride (AlNx), tantalum oxide (TaOx), hafnium oxide (HfOx), zirconium oxide (ZrOx), titanium oxide (TiOx), etc.

The gate electrode 170 may be disposed in the peripheral region 20 on the gate insulation layer 150. For example, the gate electrode 170 may be disposed on a portion of the gate insulation layer 150 under which the active layer 130 is located. The gate electrode 170 may include a metal, a metal alloy, metal nitride, conductive metal oxide, transparent conductive materials, etc. These may be used alone or in a suitable combination thereof. In some implementations, the gate electrode 170 may have a multi-layered structure.

The insulating interlayer 190 may be disposed on the gate electrode 170. The insulating interlayer 190 may cover the gate electrode 170 in the peripheral region 20 and may be disposed on the entire gate insulation layer 150. For example, the insulating interlayer 190 may sufficiently cover the gate electrode 170 on the gate insulation layer 150, and may have a substantially flat upper surface without a step around the gate electrode 170. In some implementations, the insulating interlayer 190 may cover the gate electrode 170 on the gate insulation layer 150, and may have a substantially uniform thickness along a profile of the gate electrode 170. The insulating interlayer 190 may include silicon compound, metal oxide, etc.

The source electrode 210 and the drain electrode 230 may be disposed on the insulating interlayer 190 in the peripheral region 20. The source electrode 210 may be in direct contact with a source region of the active layer 130 via a contact hole formed by removing a portion of the gate insulation layer 150 and the insulating interlayer 190. The drain electrode 230 may be in direct contact with a drain region of the active layer 130 via a contact hole formed by removing another portion of the gate insulation layer 150 and the insulating interlayer 190. Each of the source electrode 210 and the drain electrode 230 may include a metal, an alloy, metal nitride, conductive metal oxide, transparent conductive materials, etc. These may be used alone or in a suitable combination thereof. In some implementations, each of the source and drain electrodes 210 and 230 may have a multi-layered structure. Accordingly, the semiconductor element 250 including the active layer 130, the gate electrode 170, the source electrode 210, and the drain electrode 230 may be disposed.

In example embodiments, the OLED device 100 may include one transistor (e.g., the semiconductor element 250). In some implementations, the OLED device 100 may include at least two transistors and at least one capacitor.

Accordingly, the semiconductor element 250 may have a configuration including the active layer 130, the gate insulation layer 150, the gate electrode 170, the insulating interlayer 190, the source electrode 210, and the drain electrode 230.

In some implementations, the semiconductor element 250 maybe a top gate structure. In some implementations, the semiconductor element 250 may have a bottom gate structure or a double gate structure.

The planarization layer 270 may be disposed on the insulating interlayer 190, the source electrode 210, and the drain electrode 230. The planarization layer 270 may expose a portion of the semiconductor element 250. The planarization layer 270 may be disposed with sufficient thickness to cover the source electrode 210 and the drain electrode 230 on the insulating interlayer 190. The planarization layer 270 may have a substantially flat upper surface. A planarization process may be further performed on the planarization layer 270 to provide the flat upper surface of the planarization layer 270. The planarization layer 270 may include organic materials or inorganic materials. In example embodiments, the planarization layer 270 may include an organic materials such as polyimide, epoxy-based resin, acryl-based resin, polyester, photoresist, polyacryl-based resin, polyimide-based resin, a polyamide-based resin, a siloxane-based resin, etc.

In example embodiments, the planarization layer 270 may include a contact hole 275 that exposes an upper surface of the drain electrode 230 on the insulating interlayer 190 in the peripheral region 20. The planarization layer 279 may include a plurality of grooves 280 that surround the contact hole 275. A size of the contact hole 275 may be greater than a size of the grooves 280. For example, a width of each of the grooves 280 may be less than a width of the contact hole 275, and a depth of each of the grooves 280 may be less than a depth of the contact hole 275. The width of the contact hole 275 and grooves 280 may be measured at the upper surface of the planarization layer. The depth of the contact hole 275 and grooves 280 may be measured from the upper surface of the planarization layer to the bottom surface of the respective trench 291, 292. As illustrated in FIG. 2, the grooves 280 may surround the contact hole 275 and may be spaced apart from the outer portion of the contact hole 275 by a predetermined distance. The grooves 280 may be arranged along a shape of the outer portion of the contact hole 275, and may be spaced apart from each other. When the grooves 280 are spaced apart from each other, a volume of the contact hole 275 may be greater than the volume of each of the grooves 280. For example, a plurality of grooves may include first through (M)th grooves, and (K)th and (K+1)th grooves among the first through (M)th grooves may be spaced apart from each other. M may be an integer greater than 1, and K may be an integer between 1 and M. The contact hole 275 and the grooves 280 may not overlap the light emitting layer 330. For example, the light emitting layer 330 may be disposed to overlap a first portion of the lower electrode 290 (e.g., a right side of the lower electrode 290 as shown in FIG. 2), and the contact hole 275 and the grooves 280 may be located to overlap a second portion that protrudes from the first portion (e.g., a left side of the lower electrode 290 as shown in FIG. 2).

In a general OLED device including a general planarization layer and not including the plurality of grooves as described herein, external light reflectivity (e.g., reflectivity where light incident from the outside is reflected from the contact hole) may be relatively high with regard to a contact hole. According to embodiments, when a width and depth of the contact hole are increased, reflectivity may be reduced.

When the planarization layer 270 according to example embodiments includes the grooves 280 that are located around the contact hole 275, the effect of widening the width of the contact hole 275 may be obtained. Accordingly, light incident from the outside may increase a phenomenon of irregular reflection in the grooves 280 that are located around the contact hole 275, and external light reflectivity may be relatively reduced in the contact hole 275 of the planarization layer 270.

In example embodiments, a shape of, but not being limited thereto. The groove 280 may have a plan shape of a triangle, a plan shape of a tetragon, a plan shape of a diamond, a plan shape of a polygon, a plan shape of an athletic track, a plan shape of an elliptic, etc., as examples. For example, the groove 280 illustrated in FIG. 2 has a plan shape of a circle. In some implementations, each of the grooves 280 may be spaced apart from the outer portion of the contact hole 275 by an identical distance. In some implementations, each of the grooves 280 may be spaced apart from the outer portion of the contact hole 275 by different distances.

In some example embodiments, as illustrated in FIG. 3, a plurality of grooves may overlap to each other, and the grooves may be integrally formed. The integrally formed grooves may be referred to as a groove 285. For example, the groove 285 may have a plan shape of a hollow circle (e.g., a plan shape of a ring). For example, the grooves 285 may have an annular shape. The plurality of grooves may include first through (M)th grooves, and (K)th and (K+1)th grooves among the first through (M)th grooves overlap with each other. M may be an integer greater than 1, and K may be an integer between 1 and M. The overlapped grooves may be integrally formed, and may have the plan shape of the hollow circle.

A shape of the groove 285 may have a plan shape of a hollow triangle, a plan shape of a hollow tetragon, a plan shape of a hollow diamond, a plan shape of a hollow polygon, a plan shape of a hollow athletic track, a plan shape of a hollow elliptic, etc., as examples. For example, the groove 285 illustrated in FIG. 3 has a plan shape of a hollow circle Referring again to FIG. 1, the lower electrode 290 may be disposed on the planarization layer 270 in the light emitting region 10 and in the peripheral region 20. The lower electrode 290 may have a flat upper surface in the light emitting region 10, and may have an irregular upper surface in the peripheral region 20. In example embodiments, the lower electrode 290 may be in direct contact with the drain electrode 230 via the contact hole 275 of the planarization layer 270, and may be electrically connected to the semiconductor element 250. The lower electrode 290 may include a first trench 291 that overlaps the contact hole 275 of the planarization layer 270 and a second trench 292 that overlaps the grooves 280 of the planarization layer 270. For example, the lower electrode 290 may be disposed along a profile of an upper surface of the planarization layer 270. The planarization layer 270 includes the contact hole 275 and the grooves 280. Accordingly, each of the first trench 291 and the second trench 292 of the lower electrode 290 may be formed in a portion where each of the contact hole 275 and the grooves 280 is located. A size of the first trench 291 may be greater than a size of the second trench 292 in a cross-sectional view. For example, a width of the first trench 291 may be greater than a width of the second trench 292, and a depth of the first trench 291 may be greater than a depth of the second trench 292. The lower electrode 290 may include a metal, a metal alloy, metal nitride, conductive metal oxide, transparent conductive materials, etc. For example, the lower electrode 290 may include gold (Au), silver (Ag), aluminum (Al), platinum (Pt), nickel (Ni), titanium (Ti), palladium (Pd), magnesium (Mg), calcium (Ca), lithium (Li), chromium (Cr), tantalum (Ta), tungsten (W), copper (Cu), molybdenum (Mo), scandium (Sc), neodymium (Nd), iridium (Ir), an alloy of aluminum, aluminum nitride (AlNx), an alloy of silver, tungsten nitride (WNx), an alloy of copper, an alloy of molybdenum, titanium nitride (TiNx), chromium nitride (CrNx), tantalum nitride (TaNx), strontium ruthenium oxide (SRO), zinc oxide (ZnOx), indium tin oxide (ITO), tin oxide (SnOx), indium oxide (InOx), gallium oxide (GaOx), indium zinc oxide (IZO), etc. These may be used alone or in a suitable combination thereof. In some example embodiments, the lower electrode 290 may have a multi-layered structure.

The pixel defining layer 310 may be disposed on a portion of the lower electrode 290 and the planarization layer 270. The pixel defining layer 310 may cover both lateral portions of the lower electrode 290 and may have an opening exposing a portion of an upper surface of the lower electrode 290. In example embodiments, the pixel defining layer 310 may be disposed in the first and second trenches 291 and 292 of the lower electrode 290. For example, the pixel defining layer 310 may fill the first trench 291 and the second trench 292. The pixel defining layer 310 may include organic materials or inorganic materials. In example embodiments, the pixel defining layer 310 may include organic materials.

The light emitting layer 330 may be disposed on a portion of the lower electrode 290 exposed by the pixel defining layer 310. The light emitting layer 330 may be formed using at least one of light emitting materials capable of generating different colors of light (e.g., a red color of light, a blue color of light, and a green color of light, etc) according to sub-pixels. In some implementations, the light emitting layer 330 may generate a white color of light by stacking a plurality of light emitting materials capable of generating different colors of light such as a red color of light, a green color of light, a blue color of light, etc. In this case, a color filter may be disposed on the light emitting layer 330 (e.g., to overlap the light emitting layer 330 on an upper surface of the TFE structure 450). The color filter may include at least one selected from a red color filter, a green color filter, and a blue color filter. In some implementations, the color filter may include a yellow color filter, a cyan color filter, and a magenta color filter. The color filter may include a photosensitive resin, etc.

The upper electrode 340 may be disposed on the pixel defining layer 310 and the light emitting layer 330. The upper electrode 340 may cover the light emitting layer 330 and the pixel defining layer 310 and may be disposed on the entire light emitting layer 330 and the entire pixel defining layer 310. The upper electrode 340 may include a metal, a metal alloy, a metal nitride, a conductive metal oxide, a transparent conductive material, etc. These may be used alone or in a suitable combination thereof. In some example embodiments, the upper electrode 340 may have a multi-layered structure. Accordingly, the light emitting structure 200 including the lower electrode 290, the light emitting layer 330, and the upper electrode 340 may be formed.

The first TFE layer 451 may be disposed on the upper electrode 340. The first TFE layer 451 may cover the upper electrode 340 and may be disposed with a substantially uniform thickness along a profile of the upper electrode 340. The first TFE layer 451 may prevent the light emitting structure 200 from being deteriorated by the permeation of moisture, water, oxygen, etc. In addition, the first TFE layer 451 may protect the light emitting structure 200 from external impacts. The first TFE layer 451 may include inorganic materials having flexibility.

The second TFE layer 452 may be disposed on the first TFE layer 451. The second TFE layer 452 may improve the flatness of the OLED device 100 and may protect the light emitting structure 200. The second TFE layer 452 may include organic materials having flexibility.

The third TFE layer 453 may be disposed on the second TFE layer 452. The third TFE layer 453 may cover the second TFE layer 452 and may be disposed with a substantially uniform thickness along a profile of the second TFE layer 452. The third TFE layer 453 together with the first TFE layer 451 and the second TFE layer 452 may prevent the light emitting structure 200 from being deteriorated by the permeation of moisture, water, oxygen, etc. In addition, the third TFE layer 453 together with the first TFE layer 451 and the second TFE layer 452 may protect the light emitting structure 200 from external impacts. The third TFE layer 453 may include inorganic materials having flexibility. Accordingly, the TFE structure 450 including the first TFE layer 451, the second TFE layer 452, and the third TFE layer 453 may be disposed.

In some implementations, the TFE structure 450 may have a five layer structure in which first through fifth TFE layers are stacked or a seven layer structure in which the first through seventh TFE layers are stacked.

When the OLED device 100 in accordance with example embodiments includes the planarization layer 270 having the grooves 280 that are located around the contact hole 275, the effect of widening the width of the contact hole 275 may be obtained. Accordingly, the light incident from the outside may increase a phenomenon of irregular reflection in the grooves 280 that are located around the contact hole 275. A visibility of the display of the OLED device 100 may be relatively improved because the external light reflectivity is relatively reduced in the contact hole 275 of the planarization layer 270.

FIGS. 4 through 9 illustrate cross-sectional views of stages of a method of manufacturing an OLED device in accordance with example embodiments.

Figure 4:
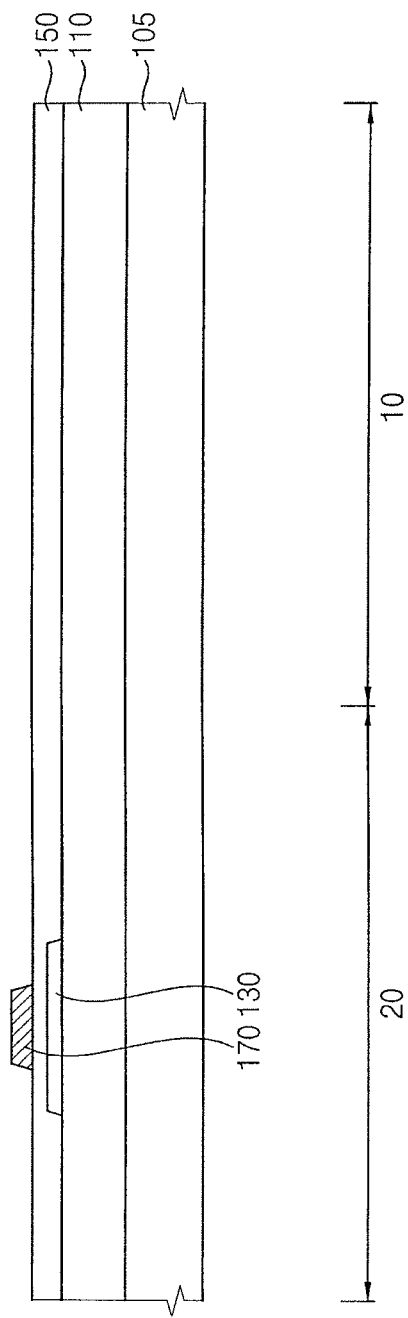

Referring to FIG. 4, a rigid glass substrate 105 may be provided. A substrate 110 including transparent materials or opaque materials may be formed on the rigid glass substrate 105. The substrate 110 may be formed using a flexible transparent material such as a flexible transparent resin substrate. In example embodiments, the substrate 110 may have a structure in which a first organic layer, a first barrier film layer, a second organic layer, a second barrier film layer are sequentially stacked. The first and second barrier film layers may be formed using inorganic materials, and the first and second organic layers may be formed using organic materials. For example, each of the first and second barrier film layers may include silicon oxide, and may block water, moisture, etc that may permeate through the first and second organic layers. Each of the first and second organic layers may include a polyimide-based resin.

In some implementations, the substrate 110 may be formed using a quartz substrate, a synthetic quartz substrate, a calcium fluoride substrate, a fluoride-doped quartz substrate, a soda-lime glass substrate, a non-alkali glass substrate etc.

A buffer layer may be formed on the substrate 110. The buffer layer may be formed over the entire substrate 110. The buffer layer may prevent the diffusion of metal atoms and/or impurities from the substrate 110 into a semiconductor element. In addition, the buffer layer may control a rate of a heat transfer in a crystallization process for forming the active layer, thereby allowing a substantially uniform active layer to be formed. Further, the buffer layer may improve a surface flatness of the substrate 110. According to a type of the substrate 110, at least two buffer layers may be provided on the substrate 110, or the buffer layer may be omitted. The buffer layer may be formed using, for example, a silicon compound, a metal oxide, etc.

An active layer 130 may be formed in the peripheral region 20 of the substrate 110. The active layer 130 may be formed using an oxide semiconductor, an inorganic semiconductor, an organic semiconductor, etc.

A gate insulation layer 150 may be formed on the active layer 130. The gate insulation layer 150 may cover the active layer 130 in the peripheral region 20 of the substrate 110, and may be formed on the entire substrate 110. For example, the gate insulation layer 150 may sufficiently cover the active layer 130 on the substrate 110, and may have a substantially flat upper surface without a step around the active layer 130. In some implementations, the gate insulation layer 150 may cover the active layer 130 on the substrate 110, and may be formed with a substantially uniform thickness along a profile of the active layer 130. The gate insulation layer 150 may be formed using silicon compound, metal oxide, etc. For example, the gate insulation layer 150 may include SiOx, SiNx, SiOxNy, SiOxCy, SiCxNy, AlOx, AlNx, TaOx, HfOx, ZrOx, TiOx, etc.

A gate electrode 170 may be formed on the gate insulation layer 150 in the peripheral region 20. The gate electrode 170 may be formed on a portion of the gate insulation layer 150 under which the active layer 130 is located. The gate electrode 170 may be formed using a metal, a metal alloy, metal nitride, conductive metal oxide, transparent conductive materials, etc. These may be used alone or in a suitable combination thereof. In some example embodiments, the gate electrode 170 may have a multi-layered structure.

Figure 5:
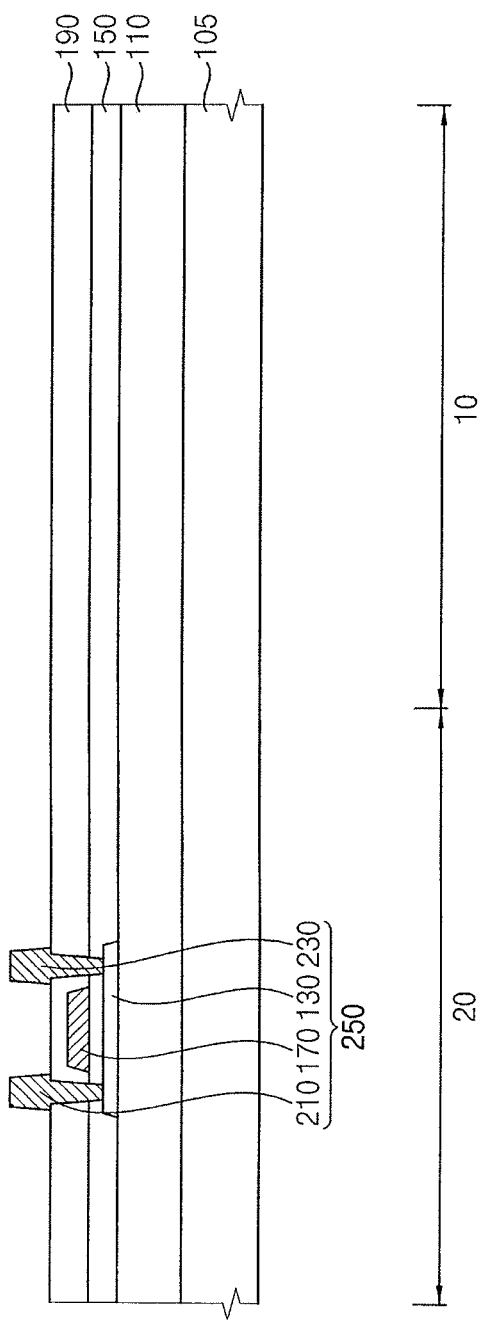

Referring to FIG. 5, an insulating interlayer 190 may be formed on the gate electrode 170. The insulating interlayer 190 may cover the gate electrode 170 in the peripheral region 20 on the gate insulation layer 150 and may be formed on the entire gate insulation layer 150. For example, the insulating interlayer 190 may sufficiently cover the gate electrode 170 on the gate insulation layer 150 and may have a substantially flat upper surface without a step around the gate electrode 170. In some implementations, the insulating interlayer 190 may cover the gate electrode 170 on the gate insulation layer 150 and may be formed with a substantially uniform thickness along a profile of the gate electrode 170. The insulating interlayer 190 may be formed using silicon compound, metal oxide, etc.

A source electrode 210 and a drain electrode 230 may be formed on the insulating interlayer 190 in the peripheral region 20. The source electrode 210 may directly contact a source region of the active layer 130 via a contact hole formed by removing a portion of the gate insulation layer 150 and the insulating interlayer 190. The drain electrode 230 may directly contact a drain region of the active layer 130 via a contact hole formed by removing another portion of the gate insulation layer 150 and the insulating interlayer 190. Each of the source electrode 210 and the drain electrode 230 may be formed using a metal, an alloy, metal nitride, conductive metal oxide, transparent conductive materials, etc. These may be used alone or in a suitable combination thereof. In some example embodiments, each of the source and drain electrodes 210 and 230 may have a multi-layered structure. Accordingly, a semiconductor element 250 including the active layer 130, the gate electrode 170, the source electrode 210, and the drain electrode 230 may be formed.

Figure 6A:
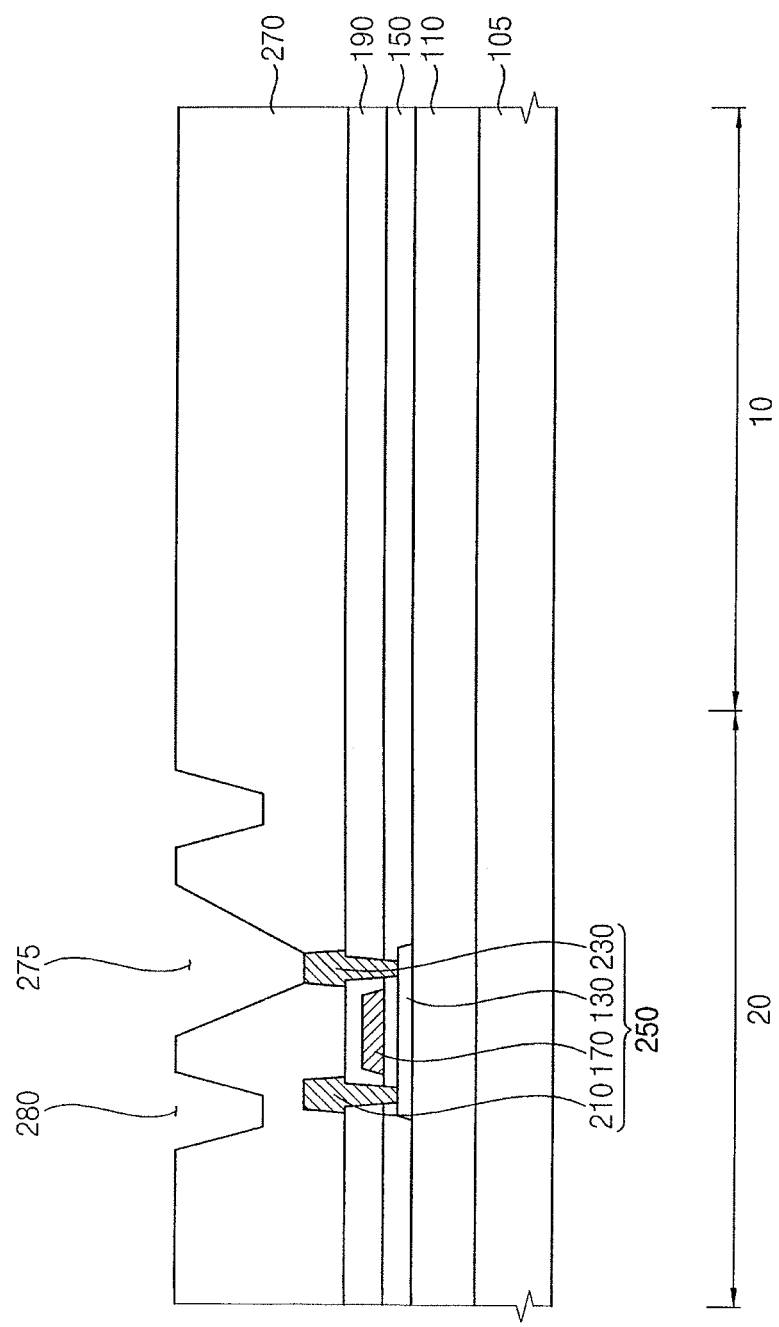
Figure 6B:
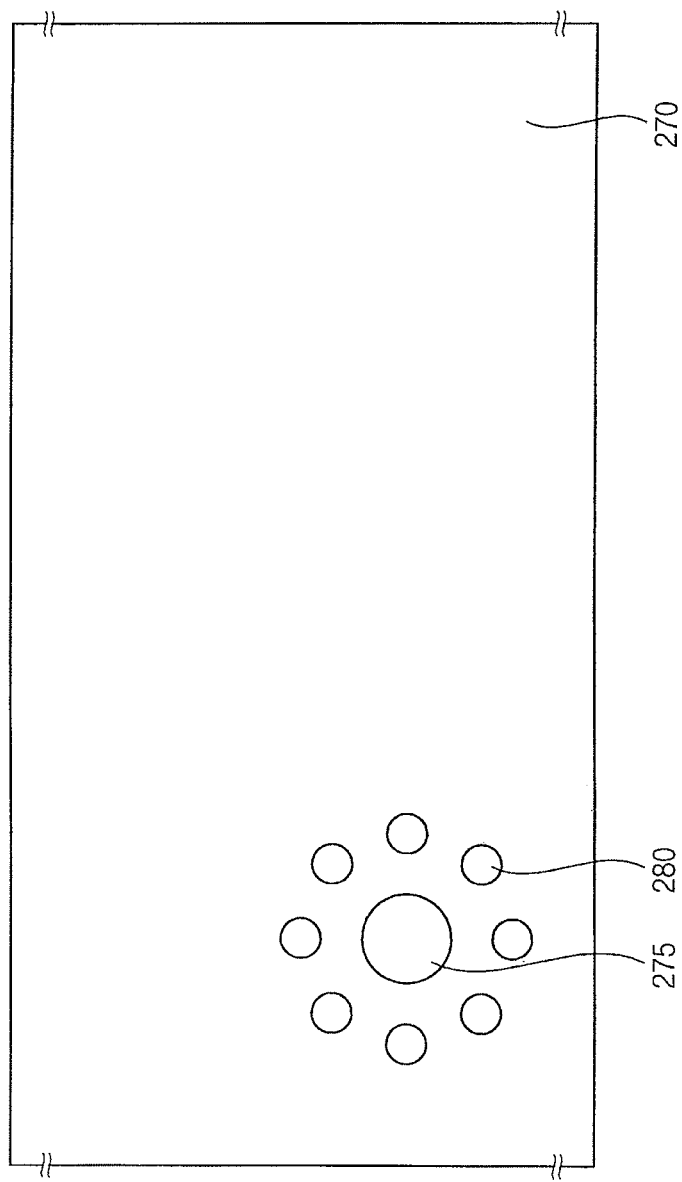

Referring to FIGS. 6A and 6B, a planarization layer 270 may be formed on the insulating interlayer 190, the source electrode 210, and the drain electrode 230, The planarization layer 270 may expose a portion of the semiconductor element 250. The planarization layer 270 may be formed with enough thickness to sufficiently cover the source electrode 210 and the drain electrode 230 on the insulating interlayer 190. The planarization layer 270 may have a substantially flat upper surface, and a planarization process may be further performed on the planarization layer 270 to provide the flat upper surface of the planarization layer 270. The planarization layer 270 may include organic materials or inorganic materials. In example embodiments, the planarization layer 270 may be formed using organic materials such as polyimide, epoxy-based resin, acryl-based resin, polyester, photoresist, polyacryl-based resin, polyimide-based resin, a polyamide-based resin, a siloxane-based resin, etc.

In example embodiments, the planarization layer 270 may include a contact hole 275 that exposes an upper surface of the drain electrode 230 in the peripheral region 20 of the insulating interlayer 190 and may have a plurality of grooves 280 that surround the contact hole 275. A size of the contact hole 275 may be greater than a size of each of the grooves 280. For example, a width of each of the grooves 280 may be less than a width of the contact hole 275, and a depth of each of the grooves 280 may be less than a depth of the contact hole 275. As illustrated in FIG. 6B, the grooves 280 may surround the contact hole 275 and may be spaced apart from the outer portion of the contact hole 275 by a predetermined distance. The grooves 280 may be arranged along a shape of the outer portion of the contact hole 275, and may be spaced apart from each other. The contact hole 275 and the grooves 280 may not overlap the light emitting layer 330.

Figure 7A:
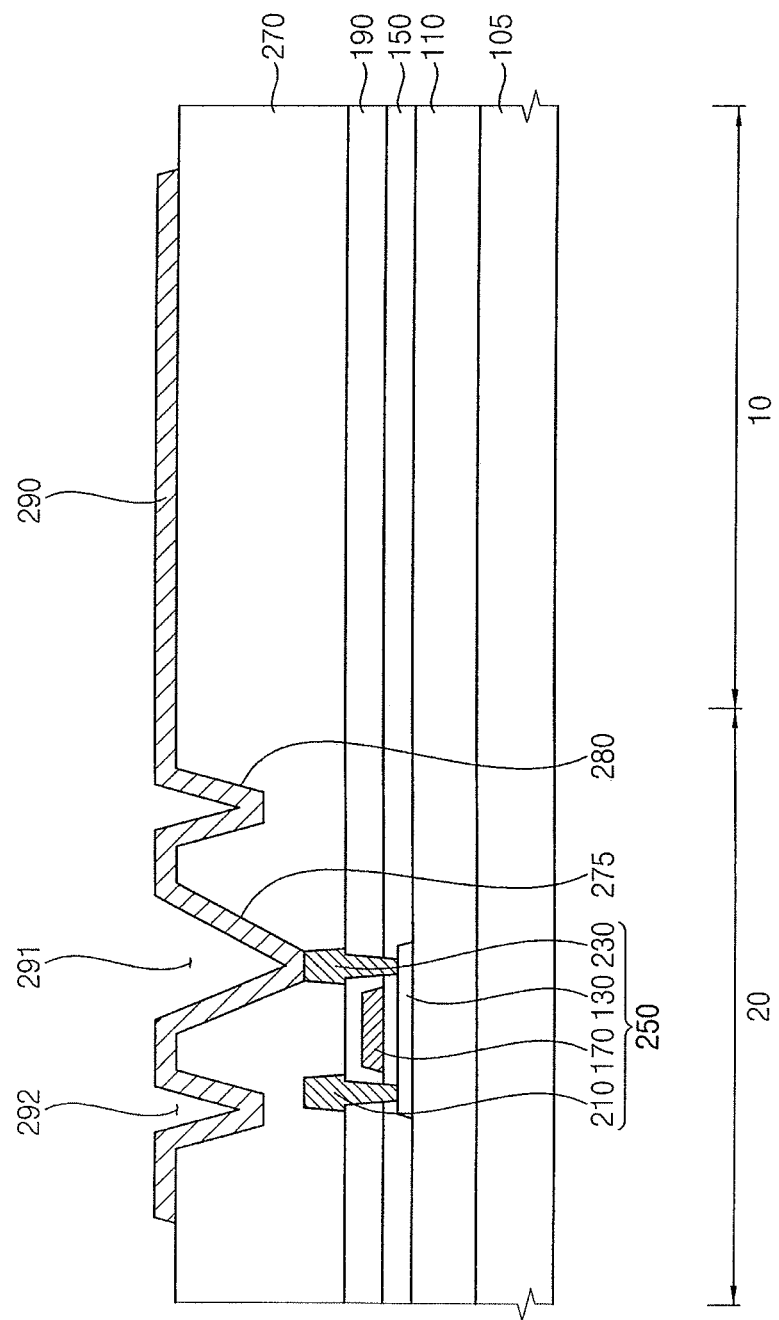
Figure 7B:
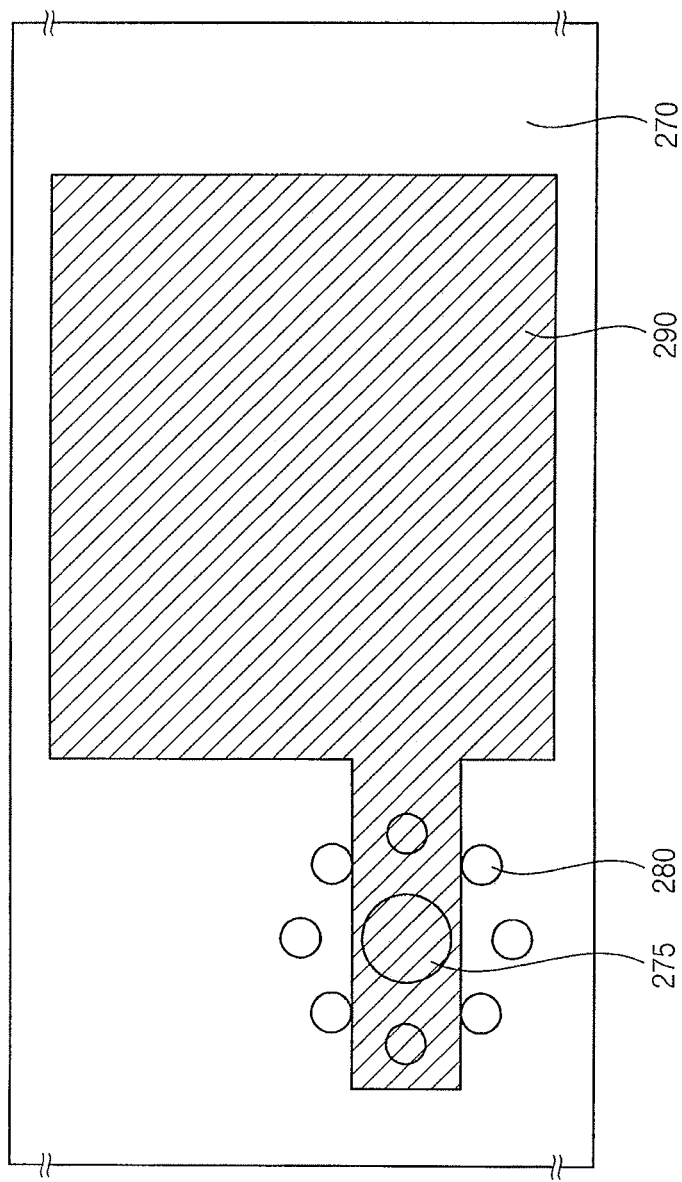

Referring to FIGS. 7A and 7B, a lower electrode 290 may be formed in the light emitting region 10 and in the peripheral region 20 of the planarization layer 270. The lower electrode 290 may have a flat upper surface in the light emitting region 10 and may have an irregular upper surface in the peripheral region 20. In example embodiments, the lower electrode 290 may directly contact the drain electrode 230 via the contact hole 275 of the planarization layer 270, and may be electrically connected to the semiconductor element 250. The lower electrode 290 may include a first trench 291 that overlaps the contact hole 275 of the planarization layer 270 and a second trench 292 that overlaps the grooves 280 of the planarization layer 270. For example, the lower electrode 290 may be formed along a profile of an upper surface of the planarization layer 270. The planarization layer 270 includes the contact hole 275 and the grooves 280. Accordingly, each of the first trench 291 and the second trench 292 of the lower electrode 290 may be formed in a portion where each of the contact hole 275 and the grooves 280 is located. A size of the first trench 291 may be greater than a size of the second trench 292. As illustrated in FIG. 7B, a light emitting layer may be formed to overlap a first portion of the lower electrode 290 (e.g., a right side of the lower electrode 290 as illustrated in FIG. 7B), and the contact hole 275 and the grooves 280 may be located to overlap a second portion that protrudes from the first portion (e.g., a left side or the lower electrode 290 as illustrated in FIG. 7B). The lower electrode 290 may be formed using a metal, a metal alloy, metal nitride, conductive metal oxide, transparent conductive materials, etc. For example, the lower electrode 290 may include, Au, Ag, Al, Pt, Ni, Ti, Pd, Mg, Ca, Li, Cr, Ta, W, Cu, Mo, Sc, Nd, Ir, an alloy of aluminum, AlNx, an alloy of silver, WNx, an alloy of copper, an alloy of molybdenum, TiNx, CrNx, TaNx, SRO, ZnOx, ITO, SnOx, InOx, GaOx, IZO, etc. These may be used alone or in a suitable combination thereof. In some example embodiments, the lower electrode 290 may have a multi-layered structure.

Referring to FIG. 8, a pixel defining layer 310 may be formed on a portion of the lower electrode 290 and the planarization layer 270. The pixel defining layer 310 may cover both lateral portion of the lower electrode 290 and may have an opening exposing a portion of an upper surface of the lower electrode 290. In example embodiments, the pixel defining layer 310 may be formed in the first and second trenches 291 and 292 of the lower electrode 290. For example, the pixel defining layer 310 may fill the first trench 291 and the second trench 292. The pixel defining layer 310 may include an organic material or an inorganic material. In example embodiments, the pixel defining layer 310 may be formed using organic materials.

A light emitting layer 330 may be formed on a portion of the lower electrode 290 exposed by the pixel defining layer 310. The light emitting layer 330 may be formed using at least one of light emitting materials capable of generating different colors of light (e.g., a red color of light, a blue color of light, and a green color of light, etc) according to sub-pixels. In some implementations, the light emitting layer 330 may generate a white color of light by stacking a plurality of light emitting materials capable of generating different colors of light such as a red color of light, a green color of light, a blue color of light, etc. In this case, a color filter may be formed on the light emitting layer 330. The color filter may include at least one selected from a red color filter, a green color filter, and a blue color filter. In some implementations, the color filter may include a yellow color filter, a cyan color filter, and a magenta color filter. The color filter may be formed using a photosensitive resin, etc.

Figure 9:
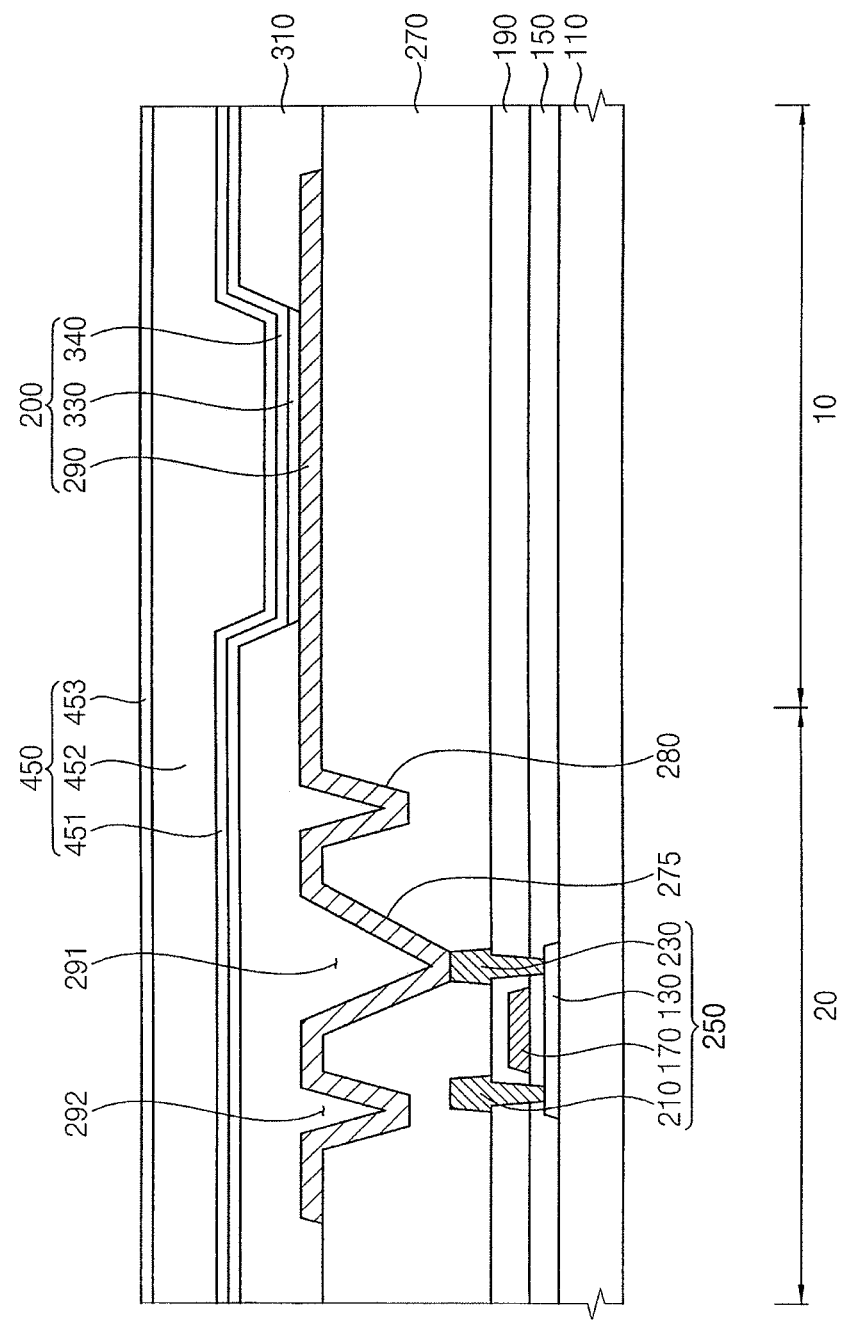

Referring to FIG. 9, an upper electrode 340 may be formed on the pixel defining layer 310 and the light emitting layer 330. The upper electrode 340 may cover the light emitting layer 330 and the pixel defining layer 310 and may be formed on the entire light emitting layer 330 and the entire pixel defining layer 310. The upper electrode 340 may be formed using a metal, a metal alloy, a metal nitride, a conductive metal oxide, a transparent conductive material, etc. These may be used alone or in a suitable combination thereof. In some example embodiments, the upper electrode 340 may have a multi-layered structure. Accordingly, a light emitting structure 200 including the lower electrode 290, the light emitting layer 330, and the upper electrode 340 may be formed.

A first TFE layer 451 may be formed on the upper electrode 340. The first TFE layer 451 may cover the upper electrode 340, and may be formed as a substantially uniform thickness along a profile of the upper electrode 340. The first TFE layer 451 may prevent the light emitting structure 200 from being deteriorated by the permeation of moisture, water, oxygen, etc. In addition, the first TFE layer 451 may protect the light emitting structure 200 from external impacts. The first TFE layer 451 may be formed inorganic materials having flexibility.

A second TFE layer 452 may be formed on the first TFE layer 451. The second TFE layer 452 may improve the flatness of an OLED device, and may protect the light emitting structure 200. The second TFE layer 452 may be formed using organic materials having flexibility.

A third TFE layer 453 may be formed on the second TFE layer 452. The third TFE layer 453 may cover the second TFE layer 452, and may be formed with a substantially uniform thickness along a profile of the second TFE layer 452. The third TFE layer 453 together with the first TFE layer 451 and the second TFE layer 452 may prevent the light emitting structure 200 from being deteriorated by the permeation of moisture, water, oxygen, etc. In addition, the third TFE layer 453 together with the first TFE layer 451 and the second TFE layer 452 may protect the light emitting structure 200 from external impacts. The third TFE layer 453 may be formed using inorganic materials having flexibility. Accordingly, a TFE structure 450 including the first TFE layer 451, the second TFE layer 452, and the third TFE layer 453 may be formed. In some implementations, the TFE structure 450 may have five layers structure in which first through fifth TFE layers are stacked or seven layers structure in which the first through seventh TFE layers are stacked.

After the TFE structure 450 is formed, the rigid glass substrate 105 may be removed from the substrate 110. Accordingly, an OLED device 100 illustrated in FIG. 1 may be manufactured.

Figure 10:
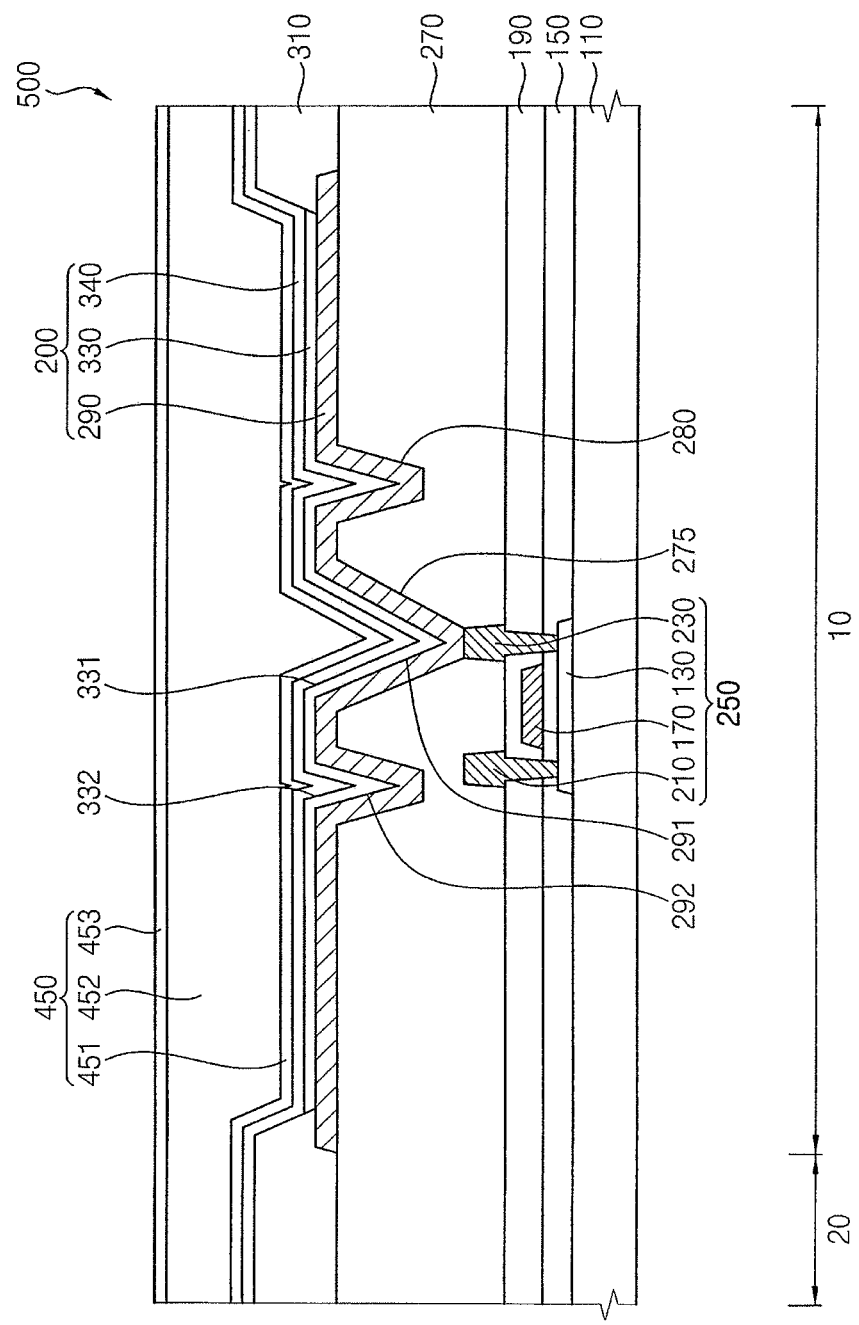
FIG. 10 illustrates a cross-sectional view depicting an organic light emitting display (OLED) device in accordance with example embodiments.
Figure 11:
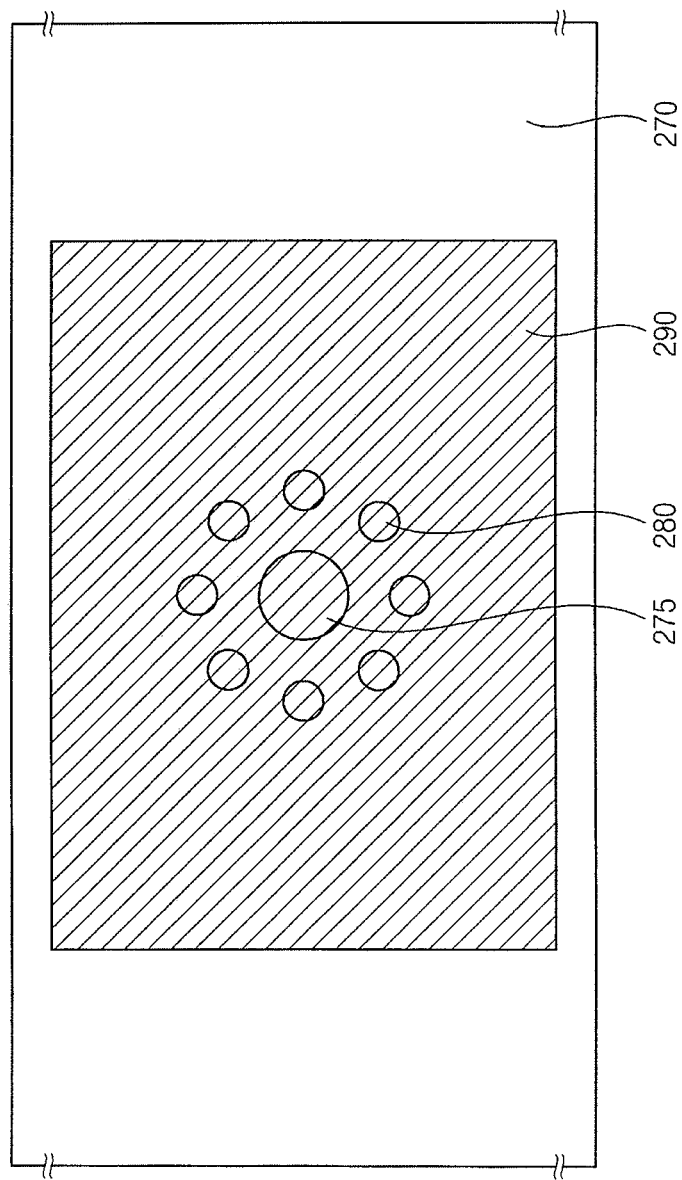
FIG. 11 illustrates a plan view for describing a contact hole and grooves of a planarization layer included in the OLED device of FIG. 10.
Figure 12:
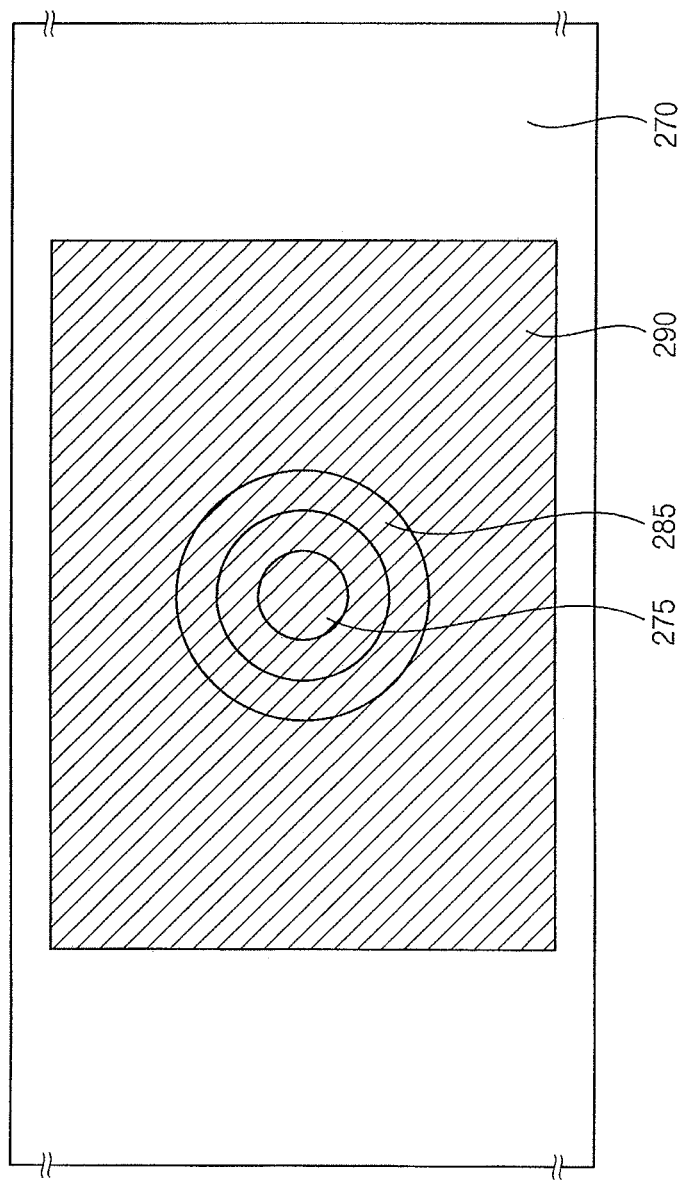
FIG. 12 illustrates a plan view depicting an example of the grooves of the planarization layer of FIG. 11.

FIG. 10 illustrates a cross-sectional view depicting an organic light emitting display (OLED) device in accordance with example embodiments, and FIG. 11 illustrates a plan view for describing a contact hole and grooves of a planarization layer included in the OLED device of FIG. 10. FIG. 12 illustrates a plan view illustrating an example of the grooves of the planarization layer of FIG. 11. An OLED device 500 illustrated in FIGS. 10, 11, and 12 may have a configuration substantially the same as or similar to that of an OLED device 100 described with reference to FIGS. 1, 2, and 3. In FIGS. 10, 11, and 12, detailed descriptions for elements that are substantially the same as or similar to elements described with reference to FIGS. 10, 11, and 12 may not be repeated.

Referring to FIGS. 10 and 11, an OLED device 500 may include a substrate 110, a semiconductor element 250, a gate insulation layer 150, an insulating interlayer 190, a planarization layer 270, a light emitting structure 200, a pixel defining layer 310, a TFE structure 450, etc.

The semiconductor element 250 may be disposed in the light emitting region 10 on the substrate 110. In example embodiments, the semiconductor element 250 may overlap the light emitting layer 330.

The planarization layer 270 may be disposed on the semiconductor element 250 and the insulating interlayer 190, and may expose a portion of the semiconductor element 250. The planarization layer 270 may include organic materials. In example embodiments, the planarization layer 270 may include a contact hole 275 that exposes an upper surface of the drain electrode 230 on the insulating interlayer 190 in the light emitting region 10, and may have a plurality of grooves 280 that surround the contact hole 275. A size of the contact hole 275 may be greater than a size of each of the grooves 280 in a cross-sectional view. For example, a width of each of the grooves 280 may be less than a width of the contact hole 275, and a depth of each of the grooves 280 may be less than a depth of the contact hole 275. As illustrated in FIG. 11, the grooves 280 may surround the contact hole 275, and may be spaced apart from the outer portion of the contact hole 275 by a predetermined distance. In addition, the grooves 280 may be arranged along a shape of the outer portion of the contact hole 275, and may be spaced apart from each other. For example, a plurality of grooves may include first through (M)th grooves, and (K)th and (K+1)th grooves among the first through (M)th grooves may be spaced apart from each other. M may be an integer greater than 1, and K may be an integer between 1 and M. The contact hole 275 and the grooves 280 may overlap the light emitting layer 330.

When the planarization layer 270 in accordance with example embodiments includes the grooves 280 that are located around the contact hole 275, the effect of widening the width of the contact hole 275 may be obtained. Accordingly, may increase a phenomenon of irregular reflection of light incident from the outside may be increased in the grooves 280 that are located around the contact hole 275, and an external light reflectivity may be relatively reduced in the contact hole 275 of the planarization layer 270.

In some example embodiments, as illustrated in FIG. 12, a plurality of grooves may overlap to each other, and the grooves may be integrally formed. The integrally formed grooves may be defined as a single groove 285. For example, the groove 285 may have a plan shape of a hollow circle (e.g., a plan shape of a ring). The plurality of grooves may include first through (M)th grooves, and (K)th and (K+1)th grooves among the first through (M)th grooves may overlap each other. M may be an integer greater than 1, and K may be an integer between 1 and M. The overlapped grooves may be integrally formed, and may have a shape of a hollow circle in a plan view.

Referring again to FIG. 10, the lower electrode 290 may be disposed in the light emitting region 10 on the planarization layer 270. A portion of the lower electrode 290 may have an irregular upper surface. In example embodiments, the lower electrode 290 may directly contact the drain electrode 230 via the contact hole 275 of the planarization layer 270, and may be electrically connected to the semiconductor element 250. The lower electrode 290 may have a first trench 291 that overlaps the contact hole 275 of the planarization layer 270 and a second trench 292 that overlaps the grooves 280 of the planarization layer 270. For example, the lower electrode 290 may be disposed along a profile of an upper surface of the planarization layer 270. When the planarization layer 270 includes the contact hole 275 and the grooves 280, each of the first trench 291 and the second trench 292 of the lower electrode 290 may be formed in a portion where each of the contact hole 275 and the grooves 280 is located. A size of the first trench 291 may be greater than a size of the second trench 292 in a cross-sectional view. For example, a width of the first trench 291 may be greater than a width of the second trench 292, and a depth of the first trench 291 may be greater than a depth of the second trench 292. The lower electrode 290 may include a metal, a metal alloy, metal nitride, conductive metal oxide, transparent conductive materials, etc. These materials may be used alone or in a suitable combination thereof. In some example embodiments, the lower electrode 290 may have a multi-layered structure.

The light emitting layer 330 may be disposed on the lower electrode 290 exposed by the pixel defining layer 310. A portion of the light emitting layer 330 may have an irregular upper surface. In example embodiments, the light emitting layer 330 may have a third trench 331 that overlaps the first trench 291 of the lower electrode 290 and a fourth trench 332 that overlaps the second trench 292 of the lower electrode 290. For example, the light emitting layer 330 may be disposed along a profile of an upper surface of the lower electrode 290. When the lower electrode 290 has the first trench 291 and the second trench 292, each of the third trench 331 and the fourth trench 332 of the light emitting layer 330 may be formed in a portion where each of the first trench 291 and the second trench 292 is located.

The light emitting layer 330 may be formed using at least one of light emitting materials capable of generating different colors of light (e.g., a red color of light, a blue color of light, and a green color of light, etc) according to sub-pixels. In some implementations, the light emitting layer 330 may generate a white color of light by stacking a plurality of light emitting materials capable of generating different colors of light such as a red color of light, a green color of light, a blue color of light, etc.

Figure 13:
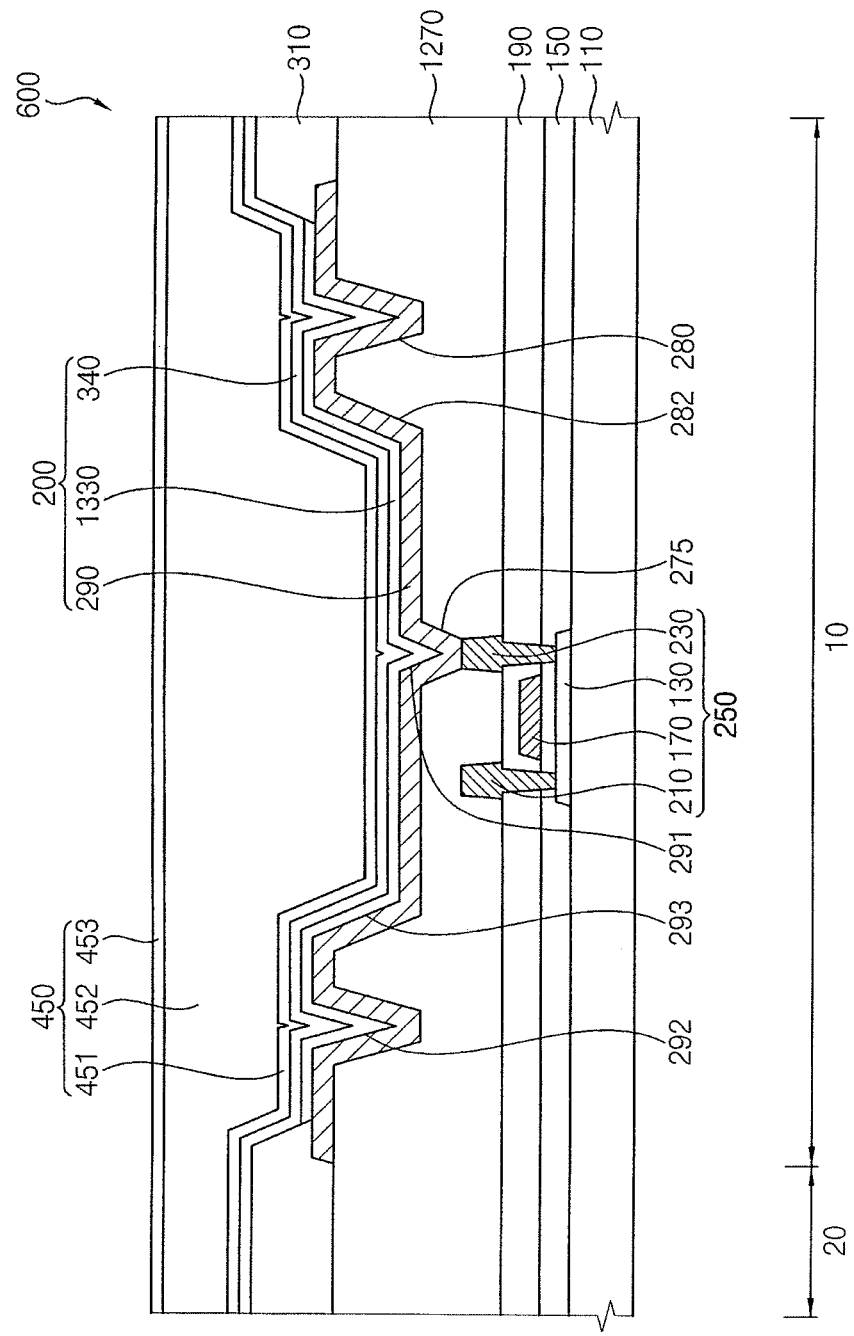
FIG. 13 illustrates a cross-sectional view depicting an organic light emitting display (OLED) device in accordance with example embodiments.

FIG. 13 illustrates a cross-sectional view illustrating an organic light emitting display (OLED) device in accordance with example embodiments. An OLED device 600 illustrated in FIG. 13 may have a configuration substantially the same as or similar to that of an OLED device 500 described with reference to FIGS. 10, 11, and 12 except for the structure of a planarization layer 1270 and a light emitting layer 1330. In FIG. 13, detailed descriptions for elements that are substantially the same as or similar to elements described with reference to FIGS. 10, 11, and 12 may not be repeated.

Referring to FIG. 13, an OLED device 600 may include a substrate 110, a semiconductor element 250, a gate insulation layer 150, an insulating interlayer 190, a planarization layer 1270, a light emitting structure 200, a pixel defining layer 310, a TFE structure 450, etc. The light emitting structure 200 may include a lower electrode 290, a light emitting layer 1330, and a upper electrode 340.

The planarization layer 1270 may be disposed on the semiconductor element 250 and the insulating interlayer 190, and may expose a portion of the semiconductor element 250. The planarization layer 270 may include organic materials. In example embodiments, the planarization layer 1270 may have a contact hole 275 that exposes an upper surface of the drain electrode 230 in the light emitting region 10 on the insulating interlayer 190, and may have a plurality of first grooves 280 that surround the contact hole 275. A size of the contact hole 275 may be less than a size of each of the first grooves 280. For example, a width of each of the first grooves 280 may be greater than a width of the contact hole 275, and a depth of each of the first grooves 280 may be less than a depth of the contact hole 275. The first grooves 280 may surround the contact hole 275, and may be spaced apart from the outer portion of the contact hole 275 by a predetermined distance. Compared to grooves 280 of FIG. 10, a distance where the first grooves 280 of FIG. 11 are spaced apart from the outer portion of the contact hole 275 may be relatively large. In example embodiments, the planarization layer 1270 may further include a second groove 282. For example, the second groove 282 may be formed inwardly from the first grooves 280, and the contact hole 275 may be located in the center of the second groove 282. The first grooves 280 may be spaced apart from the second groove 282. In addition, the first grooves 280 may be arranged along a shape of the outer portion of the second groove 282, and the first grooves 280 may be spaced apart from each other. Further, the contact hole 275, the first grooves 280, and the second groove 282 may overlap the light emitting layer 1330.

The lower electrode 290 may be disposed in the light emitting region 10 on the planarization layer 1270. A portion of the lower electrode 290 may have an irregular upper surface. In example embodiments, the lower electrode 290 may directly contact the drain electrode 230 via the contact hole 275 of the planarization layer 1270, and may be electrically connected to the semiconductor element 250. In addition, the lower electrode 290 may have a first trench 291 that overlaps the contact hole 275 of the planarization layer 1270, a second trench 292 that overlaps the first grooves 280 of the planarization layer 1270, and a third trench 293 that overlaps the second groove 282 of the planarization layer 1270. For example, the lower electrode 290 may be disposed along a profile of an upper surface of the planarization layer 1270. When the planarization layer 1270 includes the contact hole 275, the first grooves 280, and the second groove 282, each of the first trench 291, the second trench 292, and the third trench 293 of the lower electrode 290 may be formed in a portion where each of the contact hole 275, the first grooves 280, and the second groove 282 is located. A size of the first trench 291 may be less than a size of the second trench 292, and a size of the third trench 293 may be greater than a size of the second trench 292. The lower electrode 290 may include a metal, a metal alloy, metal nitride, conductive metal oxide, transparent conductive materials, etc. These may be used alone or in a suitable combination thereof. In some example embodiments, the lower electrode 290 may have a multi-layered structure.

The light emitting layer 1330 may be disposed on the lower electrode 290 exposed by the pixel defining layer 310. A portion of the light emitting layer 1330 may have an irregular upper surface. In example embodiments, compared to a light emitting layer 330 of FIG. 10, the light emitting layer 1330 of FIG. 13 may have a uniform (or flat) upper surface in the center of the light emitting layer 1330. The light emitting layer 1330 may be formed using at least one of light emitting materials capable of generating different colors of light (e.g., a red color of light, a blue color of light, and a green color of light, etc) according to sub-pixels. In some implementations, the light emitting layer 1330 may generate a white color of light by stacking a plurality of light emitting materials capable of generating different colors of light such as a red color of light, a green color of light, a blue color of light, etc.

Embodiments may be applied to various display devices including an organic light emitting display device. For example, embodiments may be applied to a vehicle-display device, a ship-display device, an aircraft-display device, portable communication devices, display devices for display or for information transfer, a medical-display device, etc.

By way of summation and review, in an OLED device, a contact hole may be formed in a planarization layer so as to electrically connect a lower electrode and a semiconductor element. However, there is a possibility that light incident from the outside could be reflected in the contact hole, and visibility of the display of the OLED device could be reduced due to the external reflection.

Embodiments provide an organic light emitting display (OLED) device including an anti-reflection layer. For example, an OLED device in accordance with example embodiments may include the planarization layer having the grooves that are located around the contact hole, such that the effect of widening the width of the contact hole may be obtained. Accordingly, a phenomenon of irregular reflection of light incident from the outside may be increased in the grooves that are located around the contact hole, and a visibility of the display of the OLED device may be relatively improved when the external light reflectivity is relatively reduced in the contact hole of the planarization layer.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. An organic light emitting display (OLED) device, comprising:
   a substrate;
   a semiconductor element on the substrate;
   a planarization layer on the semiconductor element, the planarization layer including:
      a contact hole exposing a portion of the semiconductor element; and
      a plurality of grooves, each groove completely surrounding the contact hole; and
   a light emitting structure on the planarization layer, the light emitting structure being electrically connected to the semiconductor element via the contact hole, wherein
   the grooves are integrally formed, and
   each of the grooves has a plan shape of a hollow circle.

2. The OLED device of claim 1, wherein
   the light emitting structure includes a lower electrode on the planarization layer electrically connected to the semiconductor element,
   the lower electrode overlaps a first portion of at least one groove, and
   the lower electrode does not overlap a second portion of the at least one groove.

3. The OLED device of claim 2, wherein
   the lower electrode overlaps a first portion of each groove, and
   the lower electrode does not overlap a second portion of each groove.

4. The OLED device of claim 2, wherein
   the light emitting structure further includes a light emitting layer, and
   the light emitting layer is outside an outermost groove.

5. The OLED device of claim 2, wherein
   the light emitting structure further includes a light emitting layer, and
   the light emitting layer is inside an outermost groove.

6. The OLED device of claim 1, wherein each groove has a different diameter.

7. An organic light emitting display (OLED) device, comprising:
   a substrate;
   a semiconductor element on the substrate;
   a planarization layer on the semiconductor element, the planarization layer including:
      a contact hole exposing a portion of the semiconductor element; and
      a plurality of grooves, each groove completely surrounding the contact hole; and
   a light emitting structure on the planarization layer, the light emitting structure being electrically connected to the semiconductor element via the contact hole, wherein
   the grooves include first through (M)th grooves, where M is an integer greater than 1,
   (K)th and (K+1)th grooves among the first through (M)th grooves are integrally formed, and
   the (K)th and (K+1)th grooves have a plan shape of a hollow circle.

8. The OLED device of claim 7, wherein
   the light emitting structure includes a lower electrode on the planarization layer electrically connected to the semiconductor element,
   the lower electrode overlaps a first portion of at least one groove, and
   the lower electrode does not overlap a second portion of the at least one groove.

9. The OLED device of claim 8, wherein the
   the lower electrode overlaps a first portion of each groove, and
   the lower electrode does not overlap a second portion of each groove.

10. The OLED device of claim 8, wherein
    the light emitting structure further includes a light emitting layer, and
    the light emitting layer is outside an outermost groove.

11. The OLED device of claim 8, wherein
    the light emitting structure further includes a light emitting layer, and
    the light emitting layer is inside an outermost groove.

12. The OLED device of claim 7, wherein each groove has a different diameter.

13. An organic light emitting display (OLED) device, comprising:
    a substrate;
    a semiconductor element on the substrate;
    a planarization layer on the semiconductor element, the planarization layer including:
       a contact hole exposing a portion of the semiconductor element; and
       one or more grooves, each groove completely surrounding the contact hole; and
    a light emitting structure on the planarization layer, the light emitting structure being electrically connected to the semiconductor element via the contact hole, wherein
    each groove is integrally formed.

14. The OLED device of claim 13, wherein
    the light emitting structure includes a lower electrode on the planarization layer electrically connected to the semiconductor element,
    the lower electrode overlaps a first portion of a first groove of the one or more grooves, and
    the lower electrode does not overlap a second portion of the first groove of the one or more grooves.

* * * * *